(12) United States Patent
Lee et al.

(10) Patent No.: US 10,374,026 B2
(45) Date of Patent: Aug. 6, 2019

(54) DISPLAY DEVICE

(71) Applicant: SAMSUNG DISPLAY CO., LTD., Yongin-si, Gyeonggi-do (KR)

(72) Inventors: Kwang Sae Lee, Yongin-si (KR); Myeong Hee Seo, Yongin-si (KR); Ki Myeong Eom, Yongin-si (KR); Jung Bae Bae, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 161 days.

(21) Appl. No.: 15/678,918

(22) Filed: Aug. 16, 2017

(65) Prior Publication Data

US 2018/0114824 A1 Apr. 26, 2018

(30) Foreign Application Priority Data

Oct. 25, 2016 (KR) .................. 10-2016-0139228

(51) Int. Cl.
*H01L 27/32* (2006.01)
*H01L 51/52* (2006.01)

(52) U.S. Cl.
CPC ...... *H01L 27/3276* (2013.01); *H01L 27/3246* (2013.01); *H01L 27/3265* (2013.01); *H01L 51/5203* (2013.01)

(58) Field of Classification Search
CPC .................. H01L 27/3265; H01L 27/3276
See application file for complete search history.

(56) References Cited

U.S. PATENT DOCUMENTS

| 7,435,992 B2* | 10/2008 | Choi ............... G09G 3/3233 257/72 |
| 8,957,837 B2* | 2/2015 | Han ............... G09G 3/3233 345/76 |
| 9,398,687 B2 | 7/2016 | Park |
| 9,748,323 B2* | 8/2017 | Lee ............... H01L 27/10882 |
| 9,842,893 B2* | 12/2017 | Kwon ............. H01L 27/3276 |
| 9,997,582 B2* | 6/2018 | Lee ............... H01L 27/3265 |
| 10,115,780 B2* | 10/2018 | Kim ............... H01L 27/3223 |
| 10,121,415 B2* | 11/2018 | Lee ............... H01L 27/1222 |
| 10,199,449 B2* | 2/2019 | Kim ............... H01L 27/3276 |
| 2006/0028408 A1* | 2/2006 | Kim ............... G09G 3/3233 345/76 |
| 2018/0182302 A1* | 6/2018 | Yoo ............... G09G 3/3233 |

* cited by examiner

*Primary Examiner* — Jose R Diaz
(74) *Attorney, Agent, or Firm* — F. Chau & Associates, LLC

(57) ABSTRACT

A display device includes first, second, and third insulating layers sequentially disposed on a substrate, a scan line disposed on the first insulating layer, an auxiliary power source line disposed on the second insulating layer, a data line disposed on the third insulating layer, a power source line disposed on the third insulating layer, a pixel circuit unit that includes transistors connected to the scan line, the data line, and the power source line, a bridge pattern disposed on the third insulating layer, and a light emitting diode connected to the pixel circuit unit through the bridge pattern, wherein the bridge pattern and the auxiliary power source line overlap each other to form an additional capacitor with the third insulating layer interposed therebetween.

20 Claims, 8 Drawing Sheets

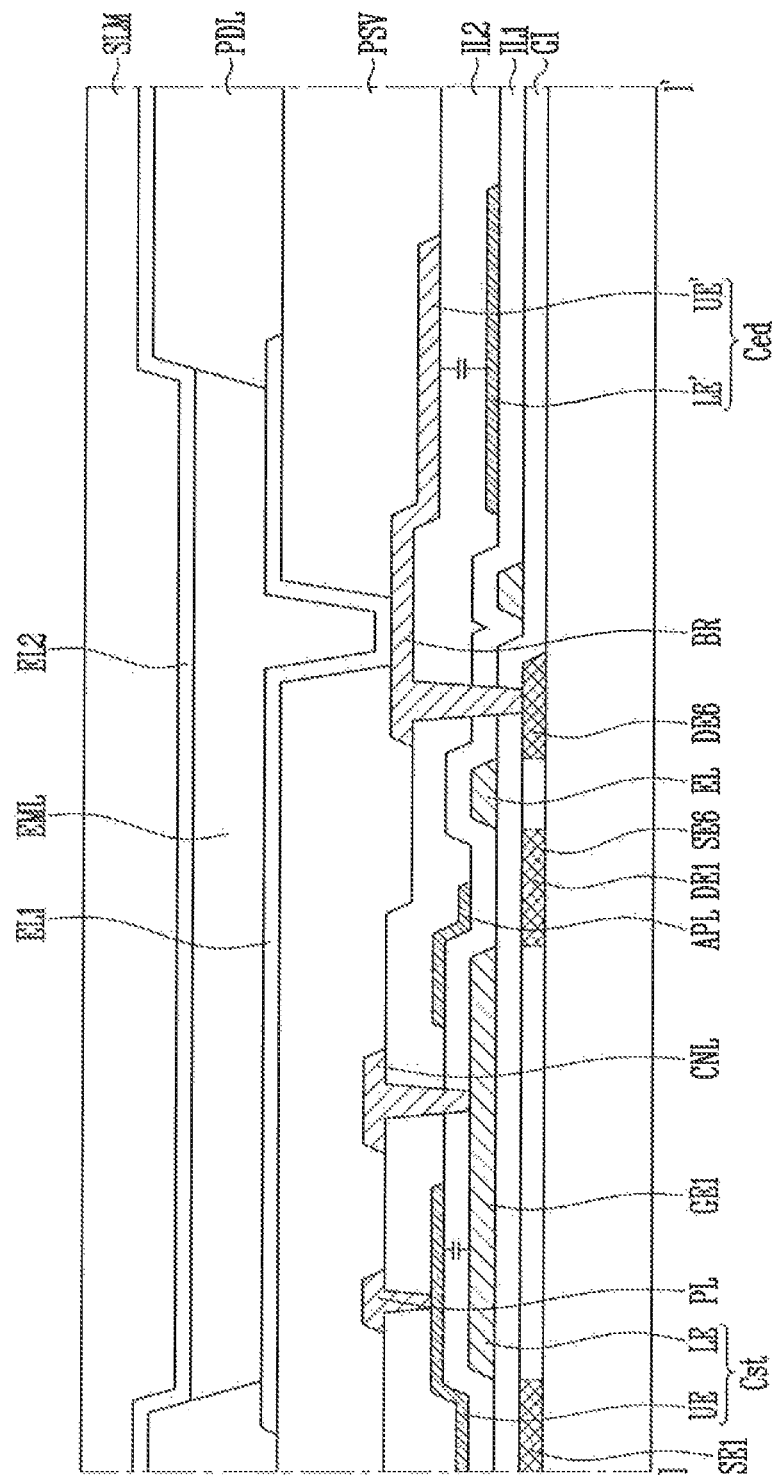

DISPLAY DEVICE

CROSS-REFERENCE TO RELATED APPLICATION

This application claims priority under 35 U.S.C. § 119 from, and the benefit of, Korean Patent Application No. 10-2016-0139228, filed on Oct. 25, 2016 in the Korean Intellectual Property Office, the contents of which are herein incorporated by reference in their entirety.

BACKGROUND

Technical Field

Embodiments of the present disclosure are directed to a display device, and more particularly, t, a display device that includes a light emitting diode.

Discussion of the Related Art

An organic light emitting display device includes two electrodes and an organic light emitting layer interposed therebetween. An exciton is generated by combining an electron injected from one electrode with a hole injected from the other electrode, and the exciton emits light and releases energy.

An organic light emitting display device includes a plurality of pixels that include light emitting diodes, which are self-emitting, and each pixel includes wires and a plurality of thin film transistors connected to the wires and that drive the light emitting diode.

A parasitic capacitor may unintentionally form between the wires and the thin film transistors, which can degrade display quality.

SUMMARY

According to an embodiment of the present disclosure, there is provided a high-resolution display device that provides a high-quality image without defects, such as bright spots or random display irregularities.

According to an embodiment of the present disclosure, a display device includes first, second, and third insulating layers sequentially disposed on a substrate, a scan line disposed on the first insulating layer, an auxiliary power source line disposed on the second insulating layer, a data line disposed on the third insulating layer, a power source line disposed on the third insulating layer, a pixel circuit unit that includes transistors connected to the scan line, the data line, and the power source line, a bridge pattern disposed on the third insulating layer, and a light emitting diode connected to the pixel circuit unit through the bridge pattern, wherein the bridge pattern and the auxiliary power source line overlap each other to form an additional capacitor with the third insulating layer interposed therebetween.

The auxiliary power source line may extend in a first direction, the power source line extends in a second direction crossing the first direction, and the power source line may be connected to the auxiliary power source line through a contact hole in the third insulating layer.

The bridge pattern may extend in the second direction to overlap the auxiliary power source line.

The transistors may include a driving transistor and a switching transistor, and a gate electrode of the driving transistor may overlap the auxiliary power source line to form a storage capacitor with the second insulating layer interposed therebetween.

The bridge pattern may be disposed on a same layer as the data line and the power source line.

The display device may further include a light emitting control line disposed on the first insulating layer and connected to the pixel circuit unit.

The auxiliary power source line may cover the light emitting control line when viewed from a plane.

The display device may further include an initialization power source line disposed on the second insulating layer and connected to the pixel circuit unit.

The light emitting diode may include a first electrode connected to the pixel circuit unit, a light emitting layer disposed on the first electrode, and a second electrode disposed on the light emitting layer.

The pixel circuit unit may include a first transistor that includes a source electrode connected to the power source line via a fifth transistor, a drain electrode connected to the first electrode of the light emitting diode via a sixth transistor, and a gate electrode connected to a first node, a second transistor that includes a source electrode connected to the data line, a drain electrode connected to the source electrode of the first transistor, and a gate electrode connected to the scan line, a third transistor that includes a source electrode connected to the drain electrode of the first transistor, a drain electrode connected to the first node, and a gate electrode connected to the scan line, a fourth transistor that includes a source electrode connected to the initialization power source line, a drain electrode connected to the first node, and a gate electrode connected to a scan line of a previous stage, the fifth transistor that includes a source electrode connected to the power source line, a drain electrode connected to the source electrode of the first transistor, and a gate electrode connected to the light emitting control line, the sixth transistor that includes a source electrode connected to the drain electrode of the first transistor, a drain electrode connected to the first electrode of the light emitting diode, and a gate electrode connected to the light emitting control line, and a seventh transistor that includes a source electrode connected to the first electrode of the light emitting diode, a drain electrode connected to the initialization power source line, and a gate electrode connected to the scan line of the previous stage.

According to an embodiment of the present disclosure, a display device includes a first transistor that includes a source electrode connected to a power source line via a fifth transistor, a drain electrode connected to a first electrode of a light emitting diode via a sixth transistor, and a gate electrode connected to a first node; a second transistor that includes a source electrode connected to a data line, a drain electrode connected to the source electrode of the first transistor, and a gate electrode connected to a scan line; a third transistor that includes a source electrode connected to the drain electrode of the first transistor, a drain electrode connected to the first node, and a gate electrode connected to the scan line; a fourth transistor that includes a source electrode connected to an initialization power source line, a drain electrode connected to the first node, and a gate electrode connected to a scan line of a previous stage; the fifth transistor that includes a source electrode connected to the power source line, a drain electrode connected to the source electrode of the first transistor, and a gate electrode connected to a light emitting control line; the sixth transistor that includes a source electrode connected to the drain electrode of the first transistor, a drain electrode connected to the first electrode of the light emitting diode, and a gate electrode connected to the light emitting control line; a seventh transistor that includes a source electrode connected to the first electrode of the light emitting diode, a drain electrode connected to the initialization power source line, and a gate electrode connected to the scan line of the previous stage; a storage capacitor connected between the power source line and the first node; and an additional capacitor connected between the power source line and the first electrode of the light emitting diode.

The display device may further include first, second, and third insulating layers sequentially disposed on a substrate; an auxiliary power source line disposed on the second insulating layer; and a bridge pattern disposed on the third insulating layer. The scan line may be disposed on the first insulating layer, the data line may be disposed on the third insulating layer, the power source line may be disposed on the third insulating layer, the light emitting control line may be disposed on the first insulating layer, and the initialization power source line may be disposed on the second insulating layer.

The drain electrode of the sixth transistor may be connected to the first electrode of the light emitting diode through the bridge pattern, and the auxiliary power source line and the bridge pattern may form the additional capacitor.

The first transistor may be a driving transistor, and a gate electrode of the driving transistor may overlap the auxiliary power source line to form the storage capacitor.

The gate electrodes of the first to seventh transistors may be disposed on a same layer as the scan line.

The light emitting diode may include the first electrode connected to the drain electrode of the first transistor, a light emitting layer disposed on the first electrode, and a second electrode disposed on the light emitting layer.

BRIEF DESCRIPTION OF THE DRAWINGS

FIG. 5 is a cross-sectional view taken along line I-I' of FIGS. 4A and 4B.

DETAILED DESCRIPTION OF EXEMPLARY EMBODIMENTS

Figure 1:
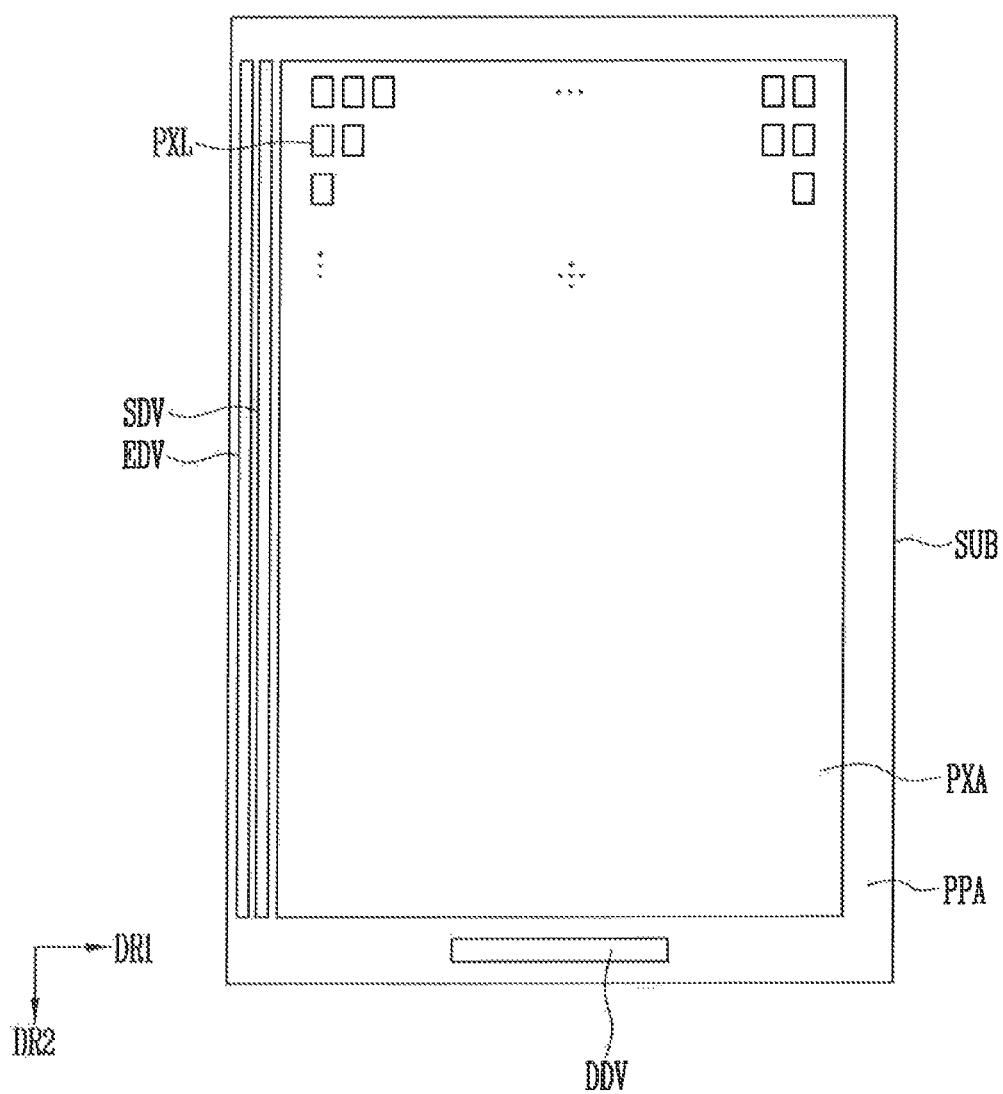
FIG. 1 illustrates a display device according to an embodiment of the present disclosure.

While embodiments of the present disclosure are shown and described in connection with exemplary embodiments, it will be apparent to those skilled in the art that various changes and modifications can be made therein without departing from the spirit and scope of the invention. Accordingly, embodiments of the inventive concept are not limited to such exemplary embodiments, but rather to the broader scope of the presented claims and various obvious modifications and equivalent arrangements.

In the following detailed description, like reference numerals may refer to like elements throughout. In the drawings, size of structures may be exaggerated for clarification.

Hereinafter, exemplary embodiments of the present disclosure will be described in detail with reference to the attached drawings.

FIG. 1 illustrates a display device according to an embodiment of the present disclosure.

Referring to FIG. 1, a display device according to an embodiment of the present disclosure includes a substrate SUB, pixels PXL disposed on the substrate SUB, a driver disposed on the substrate SUB that drives the pixels PXL, and a wire unit connecting the pixels PXL to the driver.

In the following, for convenience of explanation, an embodiment in which the substrate SUB is formed as one area will be described.

According to an embodiment, the substrate SUB is formed as a single area having a substantially rectangular shape. However, in other embodiments, the substrate SUB may have a different number of areas, and the shape of the substrate SUB may differ depending on the areas provided in the substrate SUB. In one embodiment of the present disclosure, the substrate SUB includes a plurality of areas. When the substrate SUB includes a plurality of areas, at least two of the plurality of areas are different from each other. In one embodiment, the substrate SUB has two areas, and the two areas differ from each other. Further, in another embodiment, the substrate SUB has three areas. All the three areas may differ from each other, or two of the three areas may differ from each other. In still other embodiments, the substrate SUB has four or more areas.

According to an embodiment, the substrate SUB includes a pixel area PXA and a peripheral area PPA. The pixels PXL that display an image are disposed in the pixel area PXA. A detailed description of each pixel PXL will be provided below. No pixels PXL are disposed in the peripheral area PPA, so that no image is displayed in the peripheral area PPA. The driver that drives the pixels PXL, and a portion of a wire that connects the pixels PXL to the driver, are disposed in the peripheral are PPA. The peripheral area PPA corresponds to a bezel of the final display device, and a width of the bezel is determined based on the width of the peripheral area PPA.

According to an embodiment, the substrate SUB can have various shapes. For example, the substrate SUB may have a closed polygonal shape that includes straight sides, a circular shape or an elliptical shape, etc., that include curved sides, or a semi-circular shape or a semi-elliptical shape, etc., that include a straight side and a curved side. When the substrate SUB includes a plurality of areas, each area can have a different shape, such as a closed polygonal shape that includes straight sides, a circular shape or an elliptical shape, etc., that includes curved sides, or a semi-circular shape or a semi-elliptical shape, etc., that include a straight side and a curved side.

According to an embodiment, when the substrate SUB has various shapes, at least a portion of the corners of each shape is curved. For example, the portion where adjacent straight sides or edges would otherwise meet is replaced by a curved side or edge having a predetermined curvature. That is, the vertex portion of the rectangular shape is formed of a curved edge having a predetermined curvature where two adjacent ends are connected to two adjacent straight edges. The curvature differs depending on the position of the curved edge. For example, the curvature can change depending on the position where the curved edge starts and the length of the curved edge. Hereinafter, curved corners of the substrate SUB will be referred to as a corner portion.

According to an embodiment, the pixel area PXA has a shape that corresponds to the substrate SUB.

According to an embodiment of the disclosure, the peripheral area PPA is disposed on at least one side of the pixel area PXA. The peripheral area PPA surrounds a circumference of the pixel area PXA. The peripheral area PPA includes a horizontal unit extending in a width direction, and a vertical unit extending in a length direction. The vertical unit of the peripheral area PPA is provided as a pair of vertical units which are spaced apart from each other along the width direction of the pixel area PXA.

According to an embodiment of the disclosure, the pixels PXL are disposed on the pixel area PXA of the substrate SUB. Each of the pixels PXL is a minimum unit that displays an image and a plurality of pixels PXL are provided. Each of the pixels PXL includes an organic light emitting diode that emits white and/or colored light. Colors of light emitted from each pixel PXL are one of red, green, blue, and white, but embodiments of the present disclosure are not limited thereto. For example, the colors may be one of cyan, magenta, yellow, etc.

According to an embodiment, the plurality of pixels PXL are arranged in a matrix form of rows extending in a first direction DR1 and columns extending in a second direction DR2. However, the arrangement of the pixels PXL is not limited thereto, and the pixels PXL can be arranged in various forms. For example, a portion of the pixels PXL may be arranged so that the first direction DR1 is a row direction, but another portion of the pixels PXL may be arranged so that a direction other than the first direction DR1, for example, a direction oblique to the first direction DR1, is the row direction.

According to an embodiment, the driver supplies a signal to each pixel PXL through the wire unit of each pixel PXL. A detailed description of the wire unit will be provided below.

According to an embodiment, the driver includes a scan driver SDV that transmits a scan signal to each pixel PXL along a scan line, a light emitting driver EDV that transmits a light emitting control signal to each pixel PXL along a light emitting control line, a data driver DDV that transmits a data signal to each pixel PXL along a data line, and a timing controller. The timing controller controls the scan driver SDV, the light emitting driver EDV, and the data driver DDV.

According to an embodiment, scan driver SDV is disposed in the vertical unit of the peripheral area PPA. Since the vertical unit of the peripheral area PPA includes a pair of vertical units which are spaced apart from each other along the width direction of the pixel area PXA, the scan driver SDV is disposed on at least one of the vertical units of the peripheral area PPA. The scan driver SDV extends along the length direction of the peripheral area PPA.

According to an embodiment of the present disclosure, the scan driver SDV is directly mounted on the substrate SUB. When the scan driver SDV is directly mounted on the substrate SUB, the scan driver SDV can be formed in the process of forming the pixels PXL. However, the position of the scan driver SDV and the manufacturing method of the scan driver SDV are not limited thereto. In other embodiments, the scan driver SDV can be formed on an additional chip and provided as a chip-on-glass on the substrate SUB, or mounted on a printed circuit board to be connected to the substrate SUB through a connection member.

According to an embodiment, similar to the scan driver SDV, the light emitting driver EDV is disposed on the vertical units of the peripheral area PPA. The light emitting driver EDV is disposed on at least one of the vertical units of the peripheral area PPA. The light emitting driver EDV extends along the length direction of the peripheral area PPA.

According to an embodiment of the present disclosure, the light emitting driver EDV is directly mounted on the substrate SUB. When the light emitting driver EDV is directly mounted on the substrate SUB, the light emitting driver EDV can be formed in the process of forming the pixels PXL. However, the position of the light emitting driver EDV and the manufacturing method of the light emitting driver EDV are not limited thereto. In other embodiments, the light emitting driver EDV can be formed on an additional chip and provided as a chip-on-glass on the substrate SUB, or mounted on the printed circuit board to be connected to the substrate SUB through a connection member.

According to an embodiment of the present disclosure, the scan driver SDV and the light emitting driver EDV are adjacent to each other, and the scan driver SDV and the light emitting driver EDV are formed on one of the pair of vertical units of the peripheral area PPA. However, embodiments of the present disclosure are not limited thereto, and the arrangement thereof can change in various forms in other embodiments. In some embodiments, the scan driver SDV is disposed on one of the vertical units of the peripheral area PPA, and the light emitting driver EDV is provided on the other vertical unit of the peripheral area PPA. In other embodiments, the scan driver SDV is provided on both vertical units of the peripheral area PPA and the light emitting driver EDV is provided on one of the vertical units of the peripheral area PPA.

According to an embodiment, the data driver DDV is disposed in the peripheral area PPA. Specifically, the data driver DDV is disposed in the horizontal unit of the peripheral area PPA. The data driver DDV extends along the width direction of the peripheral area PPA.

According to an embodiment of the present disclosure, the positions of the scan driver SDV, the light emitting driver EDV, and/or the data driver DDV can be changed as needed.

According to an embodiment, the timing controller is connected to the scan driver SDV, the light emitting driver EDV, and the data driver DDV through wires. The arrangement positions of the timing controller are not be limited. In some embodiments, the timing controller is mounted on the printed circuit board and connected to the scan driver SDV, the light emitting driver EDV, and the data driver DDV through a flexible printed circuit board, and the printed circuit board can be disposed at various positions of the substrate SUB, such as one side of the substrate SUB, or a rear side of the substrate SUB.

Figure 2:
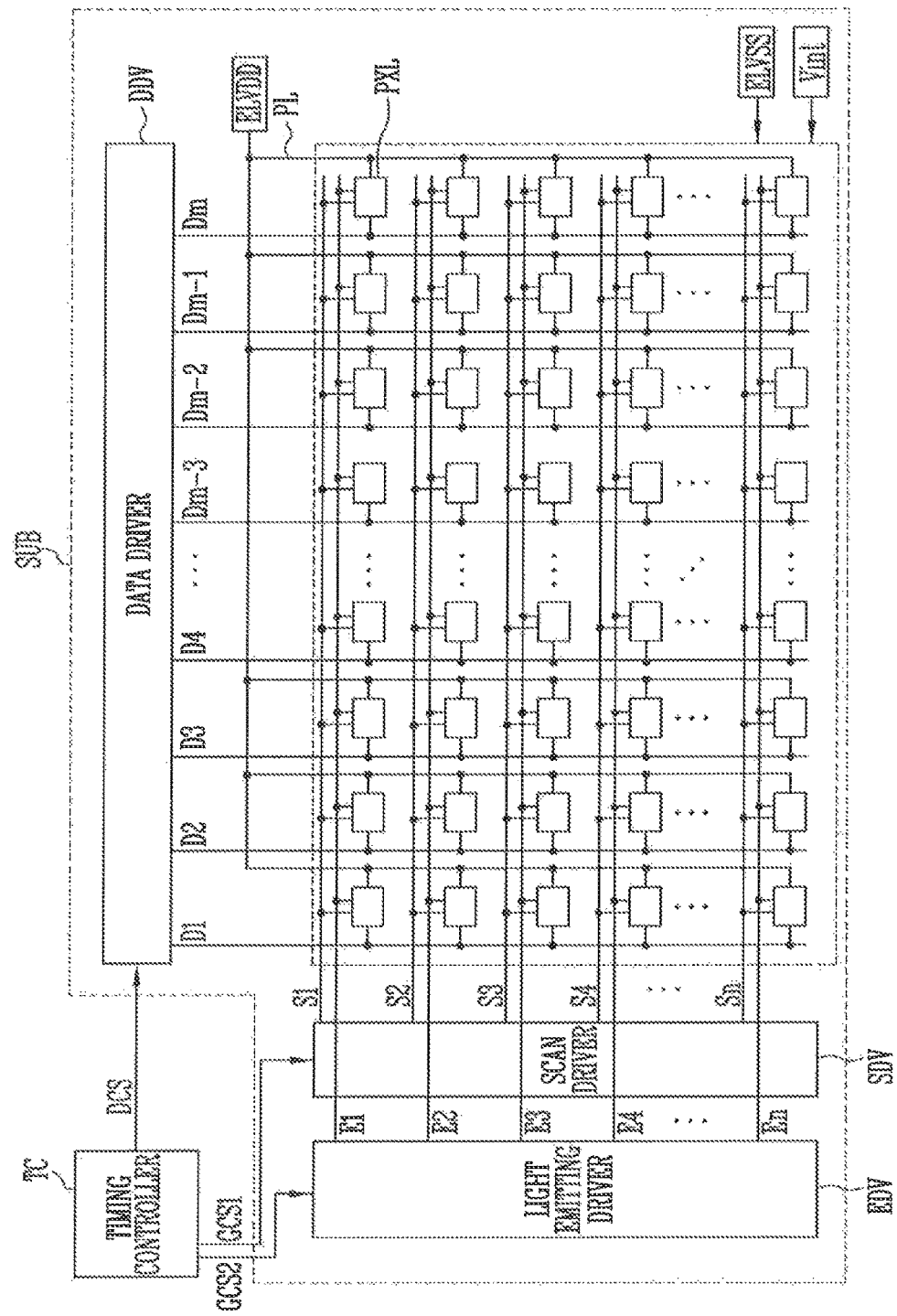
FIG. 2 is a block diagram of pixels and a driver according to an embodiment of the present disclosure.

FIG. 2 is a block diagram of pixels and a driver according to an embodiment of the present disclosure.

Referring to FIG. 2, according to an embodiment of the present disclosure, the plurality of pixels PXL are disposed in the display device. The driver includes the scan driver SDV, the light emitting driver EDV, the data driver DDV, and a timing controller TC. In FIG. 2, the positions of the scan driver SDV, the light emitting driver EDV, the data driver DDV, and the timing controller TC are set for convenience of explanation, but may be set in different positions in the display device when the display device is actually fabricated.

According to an embodiment, the wire unit transmits a signal to each pixel PXL from the driver and includes scan lines, data lines, light emitting control lines, a power source line PL, and an initialization power source line. The scan lines include a plurality of scan lines S1 to Sn, the light emitting control lines include a plurality of light emitting control lines E1 to En, and the data lines include a plurality of data lines D1 to Dm.

According to an embodiment, the pixels PXL are disposed in the pixel area PXA. The pixels PXL are be connected to the scan lines S1 to Sn, the light emitting control lines E1 to En, the data lines D1 to Dm, and the power source line PL. The pixels PXL receive data signals from the data lines D1 to Dm when scan signals are received from the scan lines S1 to Sn. The pixels PXL receiving the data signals control the amount of current flowing from a first power source ELVDD to a second power source ELVSS via an organic light emitting diode.

According to an embodiment, the scan driver SDV transmits scan signals to the scan lines S1 to Sn in response to a first gate control signal GCS1 from the timing controller TC. For example, the scan driver SDV sequentially transmits the scan signals to the scan lines S1 to Sn. When the scan signals are sequentially transmitted to the scan lines S1 to Sn, the pixels PXL are sequentially selected in a horizontal line unit.

According to an embodiment, the light emitting driver EDV transmits light emitting control signals to the light emitting control lines E1 to En in response to a second gate control signal GCS2 from the timing controller TC. For example, the light emitting driver EDV sequentially transmit the light emitting control signals to the light emitting control lines E1 to En.

According to an embodiment, the light emitting control signal has a greater width than the scan signal. For example, a light emitting control signal transmitted to an ith, light emitting control line Ei, where i is a natural number, partially overlaps a scan signal transmitted to an (i−1)th scan line Si−1 and a scan signal transmitted to an ith scan line Si.

In additional, according to an embodiment, the light emitting control signal is set to a gate-off voltage, such as a high voltage, so that transistors included in the pixels PXL are turned off, and the scan signal is set to a gate-on voltage, such as a low voltage, so that the transistors included in the pixels PXL are turned on.

According to an embodiment, the data driver DDV transmits data signals to the data lines D1 to Dm in response to a data control signal DCS. The data signals transmitted to the data lines D1 to Dm are transmitted to the pixels PXL selected by a scan signal.

According to an embodiment, the timing controller TC transmits the first and second gate control signals GCS1 and GCS2 generated from externally received timing signals to the scan drivers SDV and the light emitting drivers EDV and transmits the data control signal DCS to the data driver DDV.

According to an embodiment, each of the first and second gate control signals GCS1 and GCS2 includes a start pulse and clock signals. The start pulse controls timing of the first scan signal or the first light emitting control signal. The clock signals are used for shifting the start pulse.

According to an embodiment, the data control signal DCS includes a source start pulse and clock signals. The source start pulse controls a data sampling start point. The clock signals are used for controlling the sampling operation.

Figure 3:
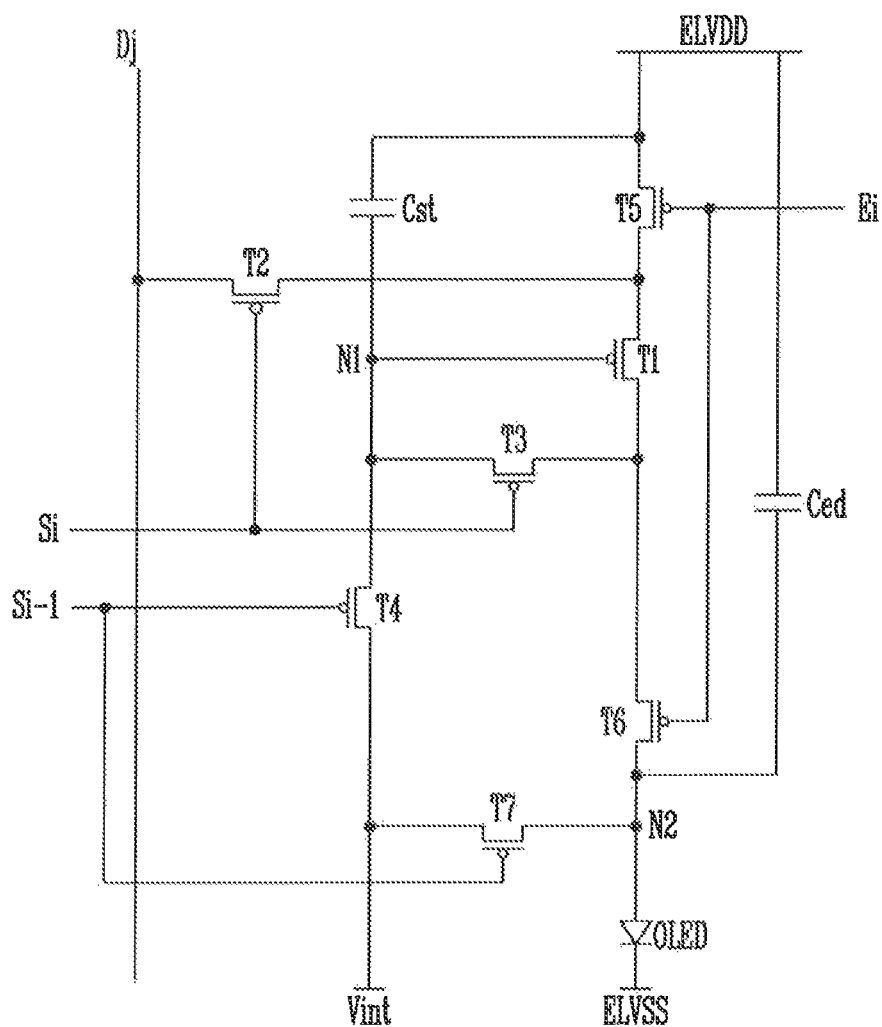
FIG. 3 shows an embodiment of a pixel shown in FIG. 2.

FIG. 3 shows an embodiment of the pixel PXL shown in FIG. 2.

For convenience of explanation, FIG. 3 shows a pixel connected to a jth data line Dj, an ith scan line Si, and an ith light emitting control line Ei.

Referring to FIG. 3, according to an embodiment of the present disclosure, the pixel PXL includes a pixel circuit unit connected to an organic light emitting diode OLED, the jth data line Dj, the (i−1)th scan line Si−1 and the ith scan line Si, and the ith light emitting control line Ei, where the pixel circuit unit controls the amount of current supplied to the organic light emitting diode OLED.

According to an embodiment, a first electrode of the organic light emitting diode OLED is connected to the pixel circuit unit, and a second electrode of the organic light emitting diode OLED is connected to the second power source ELVSS. The organic light emitting diode OLED generates light at a predetermined brightness that corresponds to the amount of current received from the pixel circuit unit. During a driving period, the second power source ELVSS is set to a voltage lower than the first power source ELVDD.

According to an embodiment, the pixel circuit unit controls the amount of current flowing from the first power source ELVDD to the second power source ELVSS via the organic light emitting diode OLED. The pixel circuit unit includes first, second, third, fourth, fifth, sixth and seventh transistors T1, T2, T3, 14, T5, T6 and T7, a storage capacitor Cst, and an additional capacitor Ced.

According to an embodiment, a source electrode of the first transistor T1 is connected to the first power source ELVDD via the fifth transistor T5, and a drain electrode of the first transistor T1 is connected to the first electrode of the organic light emitting diode OLED via the sixth transistor T6. The first transistor T1 controls the amount of current flowing from the first power source ELVDD to the second power source ELVSS via the organic light emitting diode OLED, and the amount of current flowing corresponds to a voltage of a first node N1, which is a gate electrode of the first transistor T1.

According to an embodiment, the second transistor T2 is connected between the jth data line Dj and the source electrode of the first transistor T1. In addition, a gate electrode of the second transistor T2 is connected to the ith scan line Si. The second transistor T2 is turned on when the scan signal is transmitted through the ith scan line S1 and electrically connects the jth data line Dj to the source electrode of the first transistor T1.

According to an embodiment, the third transistor T3 is connected between the drain electrode of the first transistor T1 and the first node N1. In addition, a gate electrode of the third transistor T3 is connected to the ith scan line Si. The third transistor T3 is turned on when the scan signal is transmitted through the ith scan line S1 and electrically connects the drain electrode of the first transistor T1 to the first node N1. Therefore, when the third transistor T3 is turned on, the first transistor T1 is connected as a diode.

According to an embodiment, the fourth transistor T4 is connected between the first node N1 and an initialization power source Vint. In addition, a gate electrode of the fourth transistor T4 is connected to the (i−1)th scan line Si−1. The fourth transistor T4 is turned on when the scan signal is received through the (i−1)th scan line Si−1 and transmits a voltage of the initialization power source Vint to the first node N1. The initialization power source Vint is set to a lower voltage than the data signal.

According to an embodiment, the fifth transistor T5 is connected between the first power source ELVDD and the source electrode of the first transistor T1. In addition, a gate electrode of the fifth transistor T5 is connected to the ith light emitting control line Ei. The fifth transistor T5 is turned off when the light emitting control signal is received through the ith light emitting control line Ei and turned on otherwise.

According to an embodiment, the sixth transistor T6 is connected between the drain electrode of the first transistor T1 and the first electrode of the organic light emitting diode OLED. In addition, a gate electrode of the sixth transistor T6 is connected to the ith light emitting control line Ei. The sixth transistor T6 is turned off when the light emitting control signal is transmitted through the ith light emitting control line Ei and turned on otherwise.

According to an embodiment, the seventh transistor T7 is connected between the initialization power source Vint and the first electrode of the organic light emitting diode OLED, that is, between the initialization power source Vint and a second node N2. In addition, a gate electrode of the seventh transistor T7 is connected to the (i−1)th scan line Si−1. The seventh transistor T7 is turned on when the scan signal is transmitted through the (i−1)th scan line Si−1 to supply the voltage of the initialization power source Vint to the first electrode of the organic light emitting diode OLED.

According to an embodiment, the seventh transistor T7 enhances black expression capabilities of the pixel PXL. When the seventh transistor T7 is turned on, a parasitic capacitor of the organic light emitting diode OLED is discharged. When black is displayed, the organic light emitting diode OLED will not emit light due to a leakage current from the first transistor T1, so that the black expression capabilities are enhanced.

In addition, according to an embodiment, although FIG. 3 shows that the seventh transistor T7 is connected to the (i−1)th scan line Si−1, embodiments of the present disclosure are not limited thereto. For example, the seventh transistor T7 may be received any scan signal that overlaps the light emitting control signal transmitted through the ith light emitting control line Ei.

According to an embodiment, the storage capacitor Cst stores a voltage that corresponds to the data signal and is connected between the first power source ELVDD and the first node N1.

According to an embodiment, the additional capacitor Ced can reduce coupling between the light emitting control line Ei and the first electrode of the organic light emitting diode OLED and is connected between the first power source ELVDD and the first electrode of the organic light emitting diode OLED, that is, between the first power source ELVDD and the second node N2.

According to an embodiment, in a pixel circuit unit, a coupling is generated between the first electrode of the organic light emitting diode OLED and the light emitting control line Ei. Specifically, since a pixel is very small in a high definition (HD) display device or an ultra-high definition (UHD) display device as compared with conventional pixels, an area in which the organic light emitting diode OLED is formed, that is, an aperture ratio, can be reduced. The reduced aperture ratio reduces a capacitance between the first electrode and the second electrode of the organic light emitting diode OLED, which can increase the influence of the capacitance between the light emitting control line and the first electrode when the organic light emitting diode OLED does not emit light. Specifically, the light emitting control line Ei and the first electrode of the organic light emitting diode OLED can be coupled when the light emitting control signal is turned off, and the coupling between the first electrode of the organic light emitting diode OLED and the light emitting control line Ei increases a voltage of the second node N2 between the sixth transistor T6 and the seventh transistor T7. The increased voltage of the second node N2 can cause the organic light emitting diode OLED to emit light. Even though the initialization power source Vint is reduced to prevent light emission, the reduced initialization power source Vint can increase the leakage current of the fourth transistor T4, causing weak bright spots and random display irregularities.

According to an embodiment of the present disclosure, the additional capacitor Ced is provided between the first electrode of the organic light emitting diode OLED and the first power source ELVDD to reduce the coupling between the ith light emitting control line Ei and the first electrode of the organic light emitting diode OLED.

According to an embodiment, let a coupling voltage between the light emitting control line Ei and the first electrode of the organic light emitting diode OLED be referred to as Vc, a capacitance between the light emitting control line Ei and the first electrode of the organic light emitting diode OLED be referred to as Cea, a capacitance between the first electrode and the second electrode of the organic light emitting diode OLED be referred to as Cel, a total capacitance generated when the first electrode overlaps another constituent, except for Cel, be referred to as Catotal, and a voltage variation of the light emitting control line be referred to as $\Delta V$. Then, the coupling voltage Vc is proportional to $(Cea/(Cel+Catotal))\Delta V$. In one embodiment of the present disclosure, the total capacitance Catotal increases by the additional capacitor Ced, so that the coupling voltage Vc between the light emitting control line Ei and the first electrode of the organic light emitting diode OLED is reduced.

That is, according to an embodiment, in a display device according to an embodiment of the present disclosure, the additional capacitor Ced is provided between the first power source ELVDD and the second node N2 to increase the total capacitance of the first electrode, thereby reducing coupling between the second node N2 and the light emitting control line Ei. Accordingly, the voltage of the initialization power source Vint applied to each pixel circuit unit can be increased.

Figure 4A:
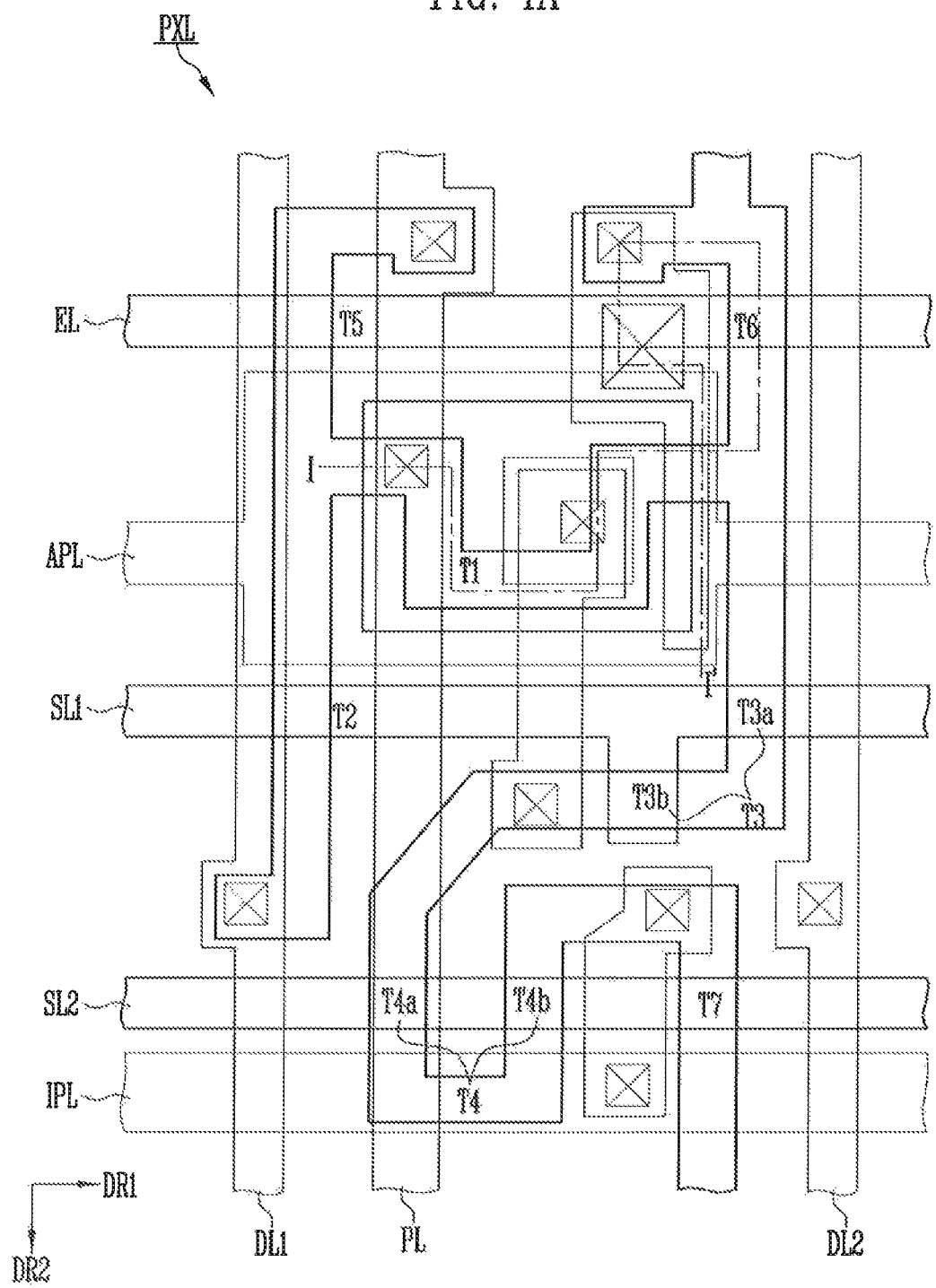
FIGS. 4A and 4B are plan views that illustrate a pixel circuit unit shown in FIG. 3 in a display device according to an embodiment of the present disclosure.
Figure 4B:
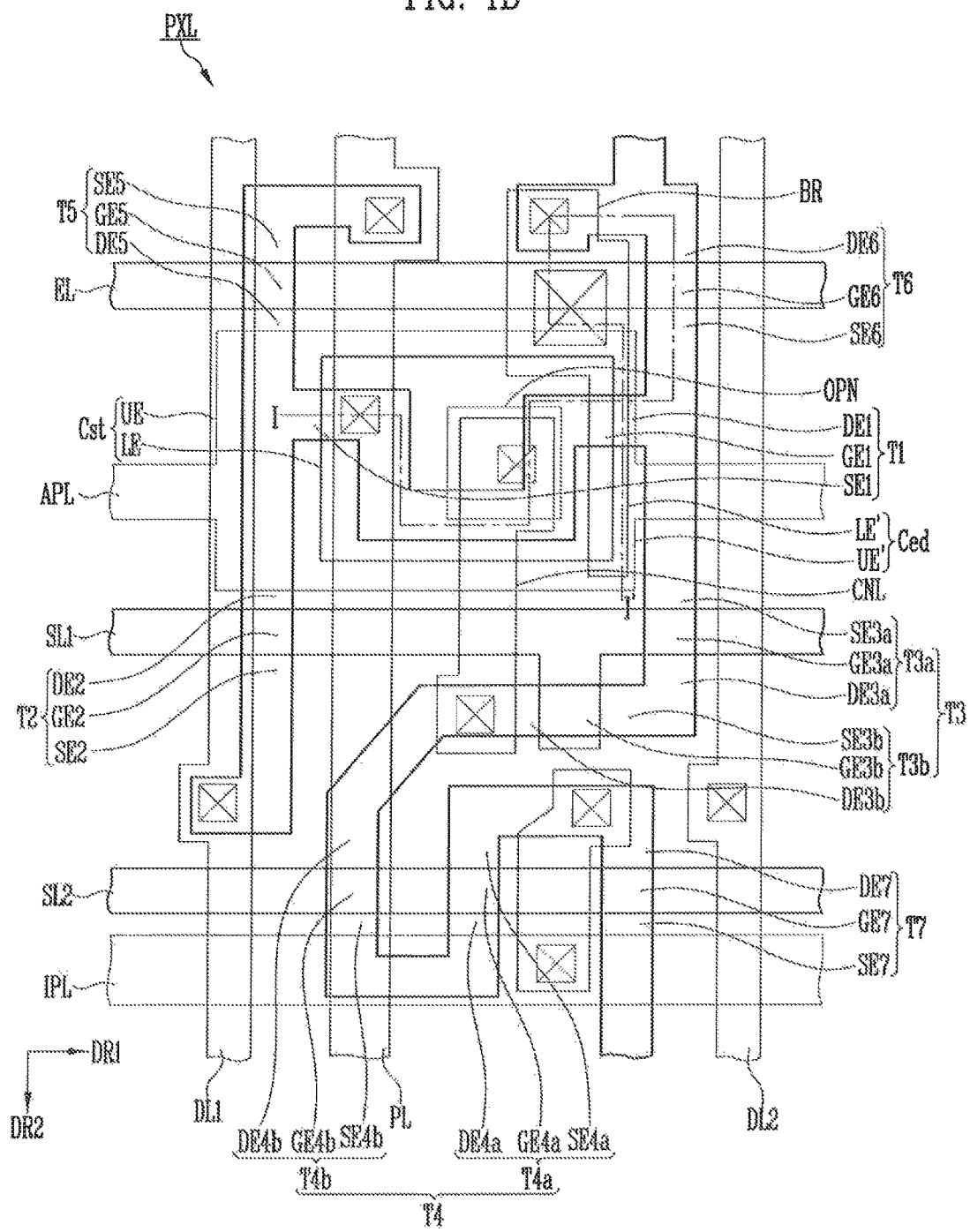

The structure of the pixel PXL according to an embodiment of the present disclosure can be implemented in various forms. FIGS. 4A and 4B are plan views that illustrate a pixel circuit unit shown in FIG. 3 of a display device according to an embodiment of the present disclosure. FIG. 5 is a cross-sectional view taken along line I-I' of FIGS. 4A and 4B.

Referring to FIGS. 4A, 4B, and 5, the pixel PXL according to an embodiment of the present disclosure includes the organic light emitting diode OLED, the first transistor T1 to the seventh transistor T7, the storage capacitor Cst, and the additional capacitor Ced. The pixel PXL is connected to the wire unit.

According to an embodiment, FIGS. 4A, 4B, and 5 show two scan lines SL1 and SL2, a light emitting control line EL, a power source line PL, and two adjacent data lines DL1 and DL2 connected to one pixel PXL arranged at an ith row and a jth column in a pixel area.

In FIGS. 4A, 4B, and 5, with regard to wires provided for one pixel, SL1 is one of the two scan lines shown in FIG. 3 and SL2 is the other scan line, EL is the light emitting control line shown in FIG. 3, DL1 is the data line shown in FIG. 3 while data line DL2 refers to a data line of an adjacent pixel, PL is the power source line in FIG. 3 to which the first power source ELVDD is applied, and IPL is an initialization power source line to which the initialization power source Vint is applied.

Referring to FIGS. 4A, 4B, and 5, according to an embodiment, the wire unit transmits a signal to each pixel PXL, where the wire unit includes the first and second scan lines SL1 and SL2, the data line DL1, the light emitting control line EL, the power source line PL, an auxiliary power source line APL, and the initialization power source line IPL.

According to an embodiment, the first and second scan lines SL1 and SL2 extend in the first direction DR1 and are sequentially arranged in the second direction DR2.

According to an embodiment, the light emitting control line EL extends in the first direction DR1 and is spaced apart from the first scan line SL1 and the second scan line SL2.

According to an embodiment, the data line DL1 extends in the second direction DR2 and is sequentially arranged in the first direction DR1.

According to an embodiment, the power source line PL extends in the second direction DR2 and is spaced apart from the data line DL1.

According to an embodiment, the auxiliary power source line APL extends in the first direction DR1 between the light emitting control line EL and the first scan line SL1. The same first power source ELVDD as is supplied to the power source line PL is applied to the auxiliary power source line APL.

According to an embodiment, the initialization power source line IPL extend in the first direction DR1 between the second scan line SL2 and the light emitting control line EL of a pixel in a subsequent row.

According to an embodiment, each pixel PXL includes the first to seventh transistors T1 to T7, the storage capacitor Cst, the additional capacitor Ced, and the organic light emitting diode OLED.

According to an embodiment, the first transistor T1 includes a first gate electrode GE1, a first source electrode SE1, and a first drain electrode DE1.

According to an embodiment, the first source electrode SE1 is connected to a fifth drain electrode DE5 of the fifth transistor T5. The first drain electrode DE1 is connected to a sixth source electrode SE6 of the sixth transistor T6. The first gate electrode GE1 is connected to a third drain electrode DE3 of the third transistor T3 and a fourth drain electrode DE4 of the fourth transistor TE4 through a connection line CNL.

According to an embodiment, the second transistor T2 includes a second gate electrode GE2, a second source electrode SE2, and a second drain electrode DE2.

According to an embodiment, the second gate electrode GE2 is connected to the first scan line SL1. The second gate electrode GE2 is a portion of the first scan line SL1 or a protrusion from the first scan line SL. According to an embodiment of the present disclosure, the second source electrode SE2 is connected to the data line DL1 through a contact hole. The second drain electrode DE2 is connected to the first source electrode SE1 of the first transistor T1 and the fifth drain electrode DE5 of the fifth transistor T5.

According to an embodiment, the third transistor T3 is a double gate structure to prevent a leakage current. That is, the third transistor T3 includes a 3a-th transistor T3a and a 3b-th transistor T3b. The 3a-th transistor T3a includes a 3a-th gate electrode GE3a, a 3a-th source electrode SE3a, and a 3a-th drain electrode DE3a. The 3b-th transistor T3b includes a 3b-th gate electrode GE3b, a 3b-th source electrode SE3b, and a 3b-th drain electrode DE3b. Hereinafter, the 3a-th gate electrode GE3a and the 3b-th gate electrode GE3b are referred to as the third gate electrode GE3, the 3a-th source electrode SE3a and the 3b-th source electrode SE3b are referred to as the third source electrode SE3, and the 3a-th drain electrode DE3a and the 3b-th drain electrode DE3b are referred to as the third drain electrode DE3.

According to an embodiment, the third gate electrode GE3 is connected to the first scan line SL1. The third gate electrode GE3 is a portion of the first scan line SL1, or a protrusion from the first scan line SL1. The third source electrode SE3 is connected to the first drain electrode DE1 of the first transistor T1 and the sixth source electrode SE6 of the sixth transistor T6. The third drain electrode DE3 is connected to the fourth drain electrode DE4 of the fourth transistor T4. The third drain electrode DE3 is connected to the first gate electrode GE1 of the first transistor T1 through the connection line CNL.

According to an embodiment, the fourth transistor T4 is a double gate structure to prevent a leakage current. That is, the fourth transistor T4 includes a 4a-th transistor T4a and a 4b-th transistor T4b. The 4a-th transistor T4a includes a 4a-th gate electrode GE4a, a 4a-th source electrode SE4a, and a 4a-th drain electrode DE4a, and the 4b-th transistor T4b includes a 4b-th gate electrode GE4b, a 4b-th source electrode SE4b, and a 4b-th drain electrode DE4b. Hereinafter, the 4a-th gate electrode GE4a and the 4b-th gate electrode GE4b are referred to as the fourth gate electrode GE4, the 4a-th source electrode SE4a and the 4b-th source electrode SE4b are referred to as the fourth source electrode SE4, and the 4a-th drain electrode DE4a and the 4b-th drain electrode DE4b are referred to as the fourth drain electrode DE4.

According to an embodiment, the fourth gate electrode GE4 is connected to the second scan line SL2. The fourth gate electrode GE4 is a part of the second scan line SL2 or a protrusion from the second scan line SL2. The fourth source electrode SE4 is connected to a seventh drain electrode DE7 of the seventh transistor T7 and the initialization power source line IPL. The fourth drain electrode DE4 is connected to the third drain electrode DE3 of the third transistor T3. The fourth drain electrode DE4 is also connected to the first gate electrode GE1 of the first transistor T1 through the connection line CNL.

According to an embodiment, the fifth transistor T5 includes a fifth gate electrode GE5, a fifth source electrode SE5, and the fifth drain electrode DE5.

According to an embodiment, the fifth gate electrode GE5 is connected to the light emitting control line EL. The fifth gate electrode GE5 is a portion of the light emitting control line EL or a protrusion from the light emitting control line EL. The fifth source electrode SE5 is connected to the power source line PL through a contact hole. The fifth drain electrode DE5 is connected to the first source electrode SE of the first transistor T1 and the second drain electrode DE2 of the second transistor T2.

According to an embodiment, the sixth transistor T6 includes a sixth gate electrode GE6, the sixth source electrode SE6, and a sixth drain electrode DE6.

According to an embodiment, the sixth gate electrode GE6 is connected to the light emitting control line EL. The sixth gate electrode GE6 is a portion of the light emitting control line EL or a protrusion from the light emitting control line EL. The sixth source electrode SE6 is connected to the first drain electrode DE1 of the first transistor T1 and the third source electrode SE3 of the third transistor T3. The sixth drain electrode DE6 is connected to a seventh source electrode SE7 of the seventh transistor T7.

According to an embodiment, the seventh transistor T7 includes a seventh gate electrode GE7, the seventh source electrode SE7, and the seventh drain electrode DE7.

According to an embodiment, the seventh gate electrode GE7 is connected to the second scan line SL2. The seventh gate electrode GE7 is a portion of the second scan line SL2, or a protrusion from the second scan line SL2. The seventh source electrode SE7 is connected to the sixth drain electrode DE6 of a pixel in a subsequent row. The seventh drain electrode DE7 is connected to the initialization power source line IPL. The seventh drain electrode DE7 is also connected to the fourth source electrode SE4 of the fourth transistor T4.

According to an embodiment, the storage capacitor Cst includes a lower electrode LE and an upper electrode UE.

According to an embodiment, the lower electrode LE of the storage capacitor Cst is the first gate electrode GE1 of the first transistor T1. The upper electrode UE of the storage capacitor Cst is the auxiliary power source line APL. The auxiliary power source line APL overlaps the first gate electrode GE1 and covers most of the first gate electrode GE1 when viewed from a plane. The capacitance of the storage capacitor Cst can be increased by increasing the overlap area between the upper electrode UE and the lower electrode LE. A contact hole formed in the auxiliary power source line APL that corresponds to the upper electrode UE of the storage capacitor Cst provides an opening OPN that connects the first gate electrode GE1 and the connection line CNL.

According to an embodiment, the additional capacitor Ced also includes a lower electrode LE' and an upper electrode UE'.

According to an embodiment, the lower electrode LE' of the additional capacitor Ced is the auxiliary power source line APL. That is, the auxiliary power source line APL is used as the upper electrode UE of the storage capacitor Cst and the lower electrode LE' of the additional capacitor Ced. The upper electrode UE' of the additional capacitor Ced is a bridge pattern BR. The bridge pattern BR is connected to the sixth drain electrode DE6 of the sixth transistor T6 through the contact hole and extends in the second direction BR2 to partially overlap at least a portion of the auxiliary power source line APL. The capacitance of the additional capacitor Ced can be increased by increasing the overlap area between the bridge pattern BR and the auxiliary power source line APL.

According to an embodiment, the bridge pattern BR can have various shapes within a range in which the overlap area between the bridge pattern BR and the auxiliary power source line APL is increased. According to an embodiment of the present disclosure, a portion of the bridge pattern BR extends in the second direction DR2, but embodiments of the present disclosure are not limited thereto. For example, portions of the bridge pattern BR can extend in the first direction DR1 or the second direction DR2, to increase the overlap area between the bridge pattern BR and the auxiliary power source line APL. The bridge pattern BR can have various shapes, such as a polygonal shape, a circular shape, etc., when viewed from a plane.

According to an embodiment, the additional capacitor Ced has the same shape for each pixel PXL, but embodiments of the present disclosure are not limited thereto. In some embodiments, the additional capacitor Ced has different capacitances in adjacent pixels PXL. For example, the capacitance of an additional capacitor Ced may depend on the color of each pixel PXL. In addition, the capacitance of the additional capacitor Ced is influenced by the overlap area between the bridge pattern BR and the auxiliary power source line APL. Thus, the capacitance of the additional capacitor Ced is matched to each pixel PXL by controlling the shape of the bridge pattern BR or the shape of the auxiliary power source line APL.

According to an embodiment, the organic light emitting diode OLED includes a first electrode EL1, a second electrode EL2, and a light emitting layer EML provided between the first electrode EL1 and the second electrode EL2.

According to an embodiment, the first electrode EL1 is disposed in a pixel area corresponding to each pixel PXL. The first electrode EL1 is connected to the bridge pattern BR through the contract hole.

Referring to FIGS. 4A, 4B, and 5, the structure of the display device according to an embodiment of the present disclosure will be described based on a stacking order.

First, according to an embodiment, a semiconductor pattern is disposed on the substrate SUB. The semiconductor pattern includes the first to seventh source electrodes SE1 to SE7, the first to seventh drain electrodes DE1 to DE7, and active patterns provided between the source electrodes SE1 to SE7 and the drain electrodes DE1 to DE7.

According to an embodiment, a buffer layer is provided between the substrate SUB and the semiconductor pattern.

According to an embodiment, a gate insulating layer GI is disposed on the substrate SUB on which the semiconductor pattern is formed.

According to an embodiment, the first scan line SL1 and the second scan line SL2, the light emitting control line EL, and the first to seventh gate electrodes GE1 to GE7 are disposed on the gate insulating layer GI. The first gate electrode GE1 is the lower electrode LE of the storage capacitor Cst.

According to an embodiment, a first insulating layer IL1 is disposed on the substrate SUB on which the first scan line SL1 is formed.

According to an embodiment, the auxiliary power source line APL and the initialization power source line IPL are disposed on the first insulating layer IL1. The auxiliary power source line APL includes the upper electrode UE of the storage capacitor Cst. That is, the lower electrode LE and the upper electrode UE form the storage capacitor Cst with the first insulating layer IL interposed therebetween.

According to an embodiment, a second insulating layer IL2 is disposed on the substrate SUB on which the auxiliary power source line APL is formed.

According to an embodiment, the data line DL1, the power source line PL, the connection line CNL, and the bridge pattern BR are disposed on the second insulating layer IL2.

According to an embodiment, data line DL1 is connected to the second source electrode SE2 through a contact hole that penetrates the first insulating layer IL1, the second insulating layer IL2, and the gate insulating layer GI. The power source line PL is connected to the auxiliary power source line APL through a contact hole that penetrates the second insulating layer IL2.

According to an embodiment, the power source line PL is connected to the fifth source electrode SE5 through the contact hole that penetrates the first insulating layer IL1, the second insulating layer IL2, and the gate insulating layer GI.

According to an embodiment, the connection line CNL is connected to the first gate electrode GE1 through a contact hole that penetrates the first insulating layer IL1 and the second insulating layer IL2. The connection line CNL connects the third drain electrode DE3 and the fourth drain electrode DE4 through the contact hole that penetrates the first insulating layer IL1 and the second insulating layer IL2.

According to an embodiment, the initialization power source line IPL is connected to the fourth source electrode SE4 of the fourth transistor T4 through a contact hole that penetrates the gate insulating layer GI, the first insulating layer IL1, and the second insulating layer IL2.

According to an embodiment, the bridge pattern BR connects the sixth drain electrode DE6 and the first electrode EL1 and connects the sixth drain electrode DE6 and the seventh source electrode SE7 through the contact hole that penetrating the gate insulating layer GI, the first insulating layer IL1, and the second insulating layer IL2.

According to an embodiment, a protective layer PSV is disposed on the substrate SUB on which the data line DL1 is formed.

According to an embodiment, the first electrode EL1 is disposed on the protective layer PSV.

According to an embodiment, the first electrode EL1 is connected to the bridge pattern BRP through a contact hole that penetrates the protective layer PSV. The bridge pattern BRP is connected to the sixth drain electrode DE6 and the seventh source electrode SE7 through the contact hole, so that the first electrode EL1 is ultimately connected to the sixth drain electrode DE6 and the seventh source electrode SE7.

According to an embodiment, a pixel definition layer PDL corresponding to each pixel PXL that defines the pixel area PA is disposed on the substrate SUB on which the first electrode EL is formed. The pixel definition layer PDL exposes an upper surface of the first electrode EL1 and protrudes from the substrate SUB along a circumference of the pixel PXL.

According to an embodiment, the light emitting layer EML is disposed in the pixel area PA surrounded by the pixel definition layer PDL, and the second electrode EL2 is disposed on the light emitting layer EML.

According to an embodiment, a sealing layer SLM that covers the second electrode EL2 is disposed on the second electrode EL2.

As described above, in a display device according to an embodiment of the present disclosure, each pixel PXL further includes the additional capacitor Ced formed between the auxiliary power source line APL and the bridge pattern BR, to reduce coupling between the light emitting control line EL and the first electrode EL1 of the organic light emitting diode OLED. Accordingly, a display device according to an embodiment of the present disclosure may display true black without defects such as bright spots or random display irregularities, even in a high resolution image of a high definition (HD) display device or an ultra-high definition (UHD) display device.

In a display device according to an embodiment of the present disclosure, the additional capacitor can have various shapes to reduce the coupling between the light emitting control line and the first electrode of the organic light emitting diode.

Figure 6:
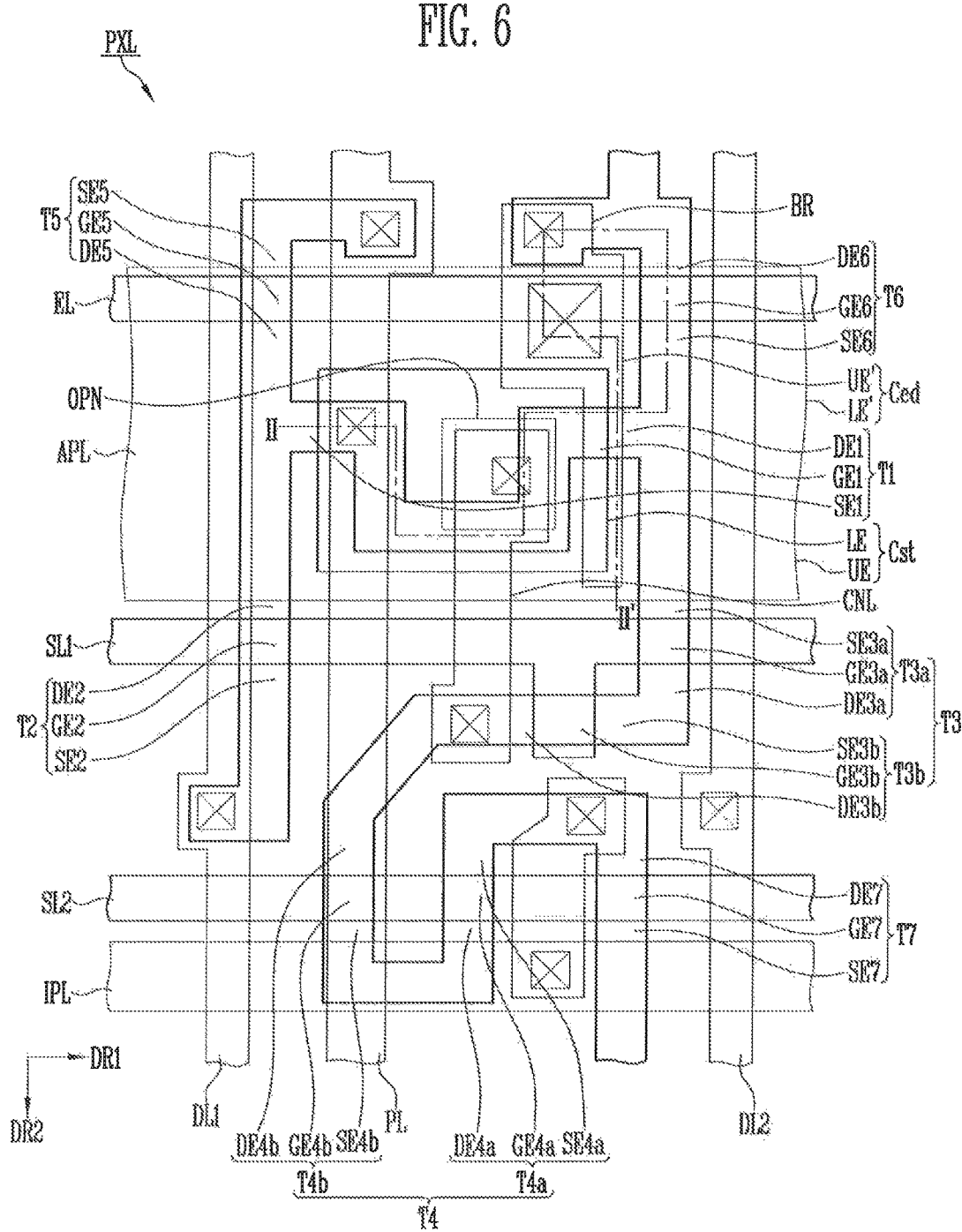
FIG. 6 is a plan view that illustrates a pixel circuit shown in FIG. 3 in a display device according to an embodiment of the present disclosure.
Figure 7:
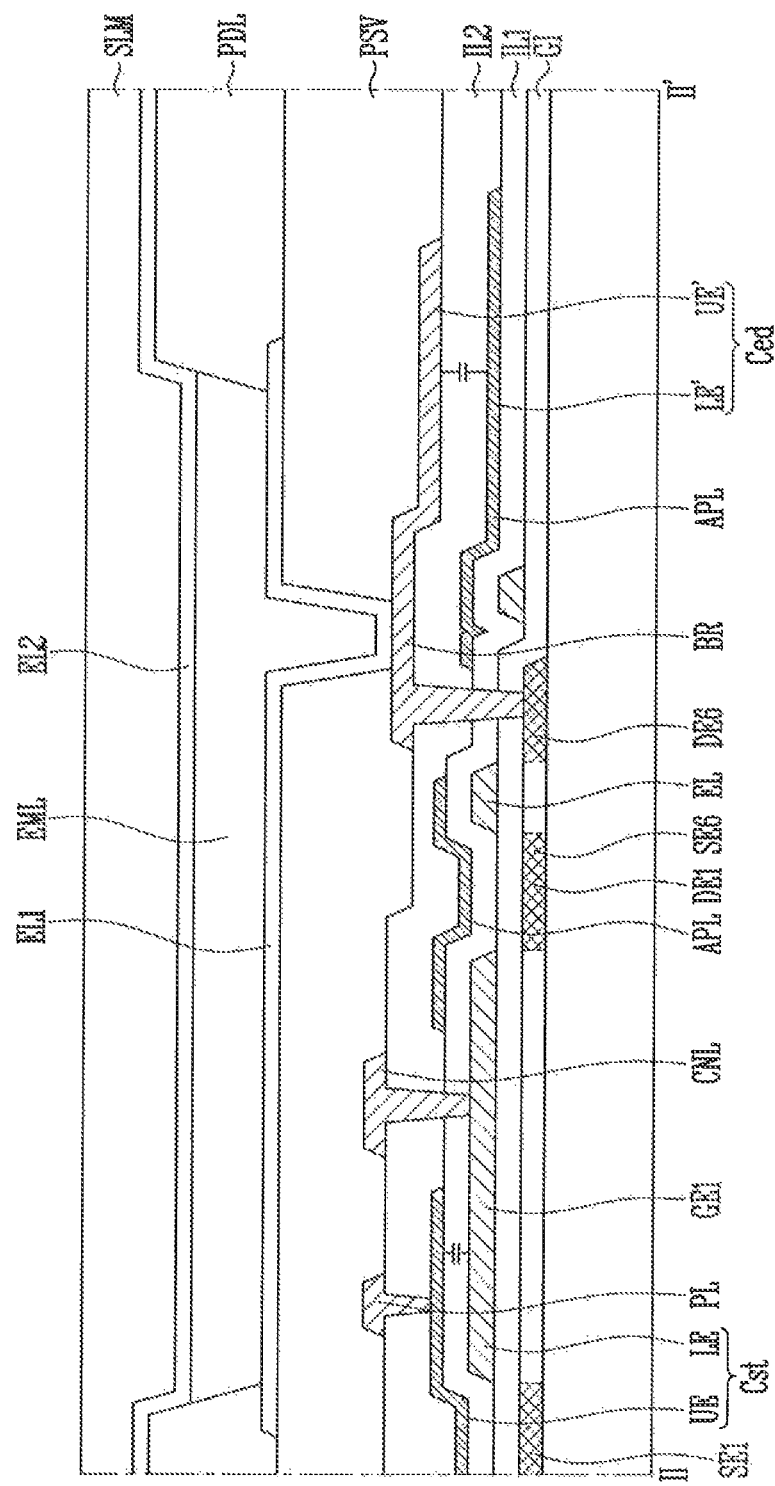
FIG. 7 is a cross-sectional view taken along line II-II' of FIG. 6.

FIG. 6 is a plan view that illustrates a pixel circuit shown in FIG. 3 of a display device according to an embodiment of the present disclosure. FIG. 7 is a cross-sectional view taken along line II-II' of FIG. 6. In an embodiment of the present disclosure, features that differ from the above-described embodiment will be described to avoid redundant explanation.

Referring to FIGS. 6 and 7, the pixel PXL according to an embodiment of the present disclosure includes the organic light emitting diode OLED, a first transistor T1 to a seventh transistor T7, a storage capacitor Cst, and an additional capacitor Ced.

According to an embodiment, pixel PXL is connected to the wire unit. The wire unit transmits a signal to each pixel PXL and includes first and second scan lines SL1 and SL2, a data line DL1, a light emitting control line EL, a power source line PL, an auxiliary power source line APL, and an initialization power source line IPL.

According to an embodiment, the first and second scan lines SL1 and SL2 extend in a first direction DR1 and are sequentially arranged along a second direction DR2. The first and second scan lines SL1 and SL2 are disposed on a gate insulating layer GI.

According to an embodiment, the light emitting control line EL extends in the first direction DR1 and is spaced apart from the first scan line SL1 and the second scan line SL2. The light emitting control line EL is disposed on the gate insulating layer GI.

According to an embodiment, the data line DL1 extends in the second direction DR2 is sequentially arranged along the first direction DR1. The data line DL1 is disposed on a second insulating layer IL2.

According to an embodiment, the power source line PL extends in the second direction DR2 spaced apart from the data line DL1. The power source line PL is disposed on the same layer as the data line DL, that is, on the second insulating layer IL2.

According to an embodiment, the auxiliary power source line APL extends along the first direction DR1 and is disposed between the light emitting control line EL and the first scan line SL1. A first power source ELVDD is applied to the auxiliary power source line APL in the same manner as the power source line PL. The auxiliary power source line APL is disposed on a first insulating layer IL1.

According to an embodiment, the initialization power source line IPL extends along the first direction DR1 and is disposed between the second scan line SL2 and the light emitting control line EL of a pixel in a subsequent row. The initialization power source line IPL is disposed on the same layer as the auxiliary power source line APL, that is, on the first insulating layer IL1.

According to an embodiment, the storage capacitor Cst includes a lower electrode LE and an upper electrode UE.

According to an embodiment, the first to seventh transistors T1 to T7 include first to seventh gate electrodes GE1 to GE7, first to seventh source electrodes SE1 to SE7, and first to seventh drain electrodes DE1 to DE7. The first to seventh gate electrodes GE1 to GE7 are disposed on the gate insulating layer GI and the first to seventh source electrodes SE1 to SE7 and the first to seventh drain electrodes DE1 to DE7 are disposed below the gate insulating layer GI, opposite from the first to seventh gate electrodes GE1 to GE7.

According to an embodiment, the lower electrode LE of the storage capacitor Cst includes the first gate electrode GE1 of the first transistor T1. The upper electrode UE of the storage capacitor Cst includes the auxiliary power source line APL.

According to an embodiment, the auxiliary power source line APL overlaps the first gate electrode GE1 and extends along the first direction DR1 when viewed from a plane. The auxiliary power source line APL covers most of the first gate electrode GE1 and the space between the light emitting control line EL and the first scan line SL1, and overlaps the light emitting control line EL when viewed from a plane. In one embodiment of the present disclosure, the auxiliary power source line APL completely covers the light emitting control line EL. The auxiliary power source line APL is connected to the power source line PL, and the first power source ELVDD is applied thereto (see FIG. 2).

Accordingly, according to an embodiment, the capacitance of the storage capacitor Cst can be increased by increasing the overlap area between the upper electrode UE and the lower electrode LE. In addition, the auxiliary power source line APL covers the light emitting control line EL, which reduces the coupling between the light emitting control line EL and a first electrode EL1 of the organic light emitting diode OLED. Accordingly, the potential of the first electrode EL1 of the organic light emitting diode OLED can be lowered, and the same potential can be maintained even when the light emitting control signal is turned off, which can reduce the amount of current flowing into the organic light emitting diode OLED, thereby preventing light emission.

According to an embodiment, the additional capacitor Ced also includes a lower electrode LE' and an upper electrode UE'.

According to an embodiment, the lower electrode LE' of the additional capacitor Ced includes the auxiliary power source line APL. That is, the auxiliary power source line APL can be used as the upper electrode UE of the storage capacitor Cst and the lower electrode LE' of the additional capacitor Ced. The upper electrode UE' of the additional capacitor Ced is a bridge pattern BR. The capacitance of the additional capacitor Ced can be increased by increasing the overlap area between the bridge pattern BR and the auxiliary power source line APL.

As a result, according to an embodiment, the coupling between a second node N2 (see FIG. 3) and the light emitting control line Ei can be minimized by shielding a space between the light emitting control line EL and the first electrode EL1 by using the auxiliary power source line APL and providing the additional capacitor Ced between the first power source ELVDD and the second node N2. Accordingly, the voltage of the initialization power source Vint applied to each pixel circuit unit can be increased. Accordingly, a display device according to an embodiment of the present disclosure can display black without defects such as bright spots and random display irregularities, even in a high resolution image.

A display device having an above-described structure according to an embodiment, and in other embodiments may be incorporated into various applications, such as mobile devices, smart phones, electronic books, laptop computers, notebook computers, tablet computers, personal computers, billboards, etc., but embodiments of the present disclosure are not limited thereto.

A display device according to an embodiment of the present disclosure can display true black without defects, such as bright spots or random display irregularities, even in a high resolution image.

While embodiments of the present inventive concept have been particularly shown and described with reference to exemplary embodiments thereof, it will be understood by those of ordinary skill in the art that various changes in form and details may be made therein without departing from the spirit and scope of the inventive concept as defined by the following claims.

Therefore, the technical scope of exemplary embodiments of the present disclosure should not be limited to the contents described in the detailed description of the specification, but should be defined by the scope of claims.

What is claimed is:

1. A display device, comprising:
   first, second, and third insulating layers sequentially disposed on a substrate;
   a scan line disposed on the first insulating layer;
   an auxiliary power source line disposed on the second insulating layer;
   a data line disposed on the third insulating layer;
   a power source line disposed on the third insulating layer;
   a pixel circuit unit that includes transistors connected to the scan line, the data line, and the power source line;
   a bridge pattern disposed on the third insulating layer; and
   a light emitting diode connected to the pixel circuit unit through the bridge pattern,
   wherein the bridge pattern and the auxiliary power source line overlap each other to form an additional capacitor with the third insulating layer interposed therebetween.

2. The display device of claim 1, wherein the auxiliary power source line extends in a first direction, the power source line extends in a second direction crossing the first direction, and the power source line is connected to the auxiliary power source line through a contact hole in the third insulating layer.

3. The display device of claim 2, wherein the bridge pattern extends in the second direction to overlap the auxiliary power source line.

4. The display device of claim 1, wherein the transistors include a driving transistor and a switching transistor, and a gate electrode of the driving transistor overlaps the auxiliary power source line to form a storage capacitor with the second insulating layer interposed therebetween.

5. The display device of claim 4, wherein the bridge pattern is disposed on a same layer as the data line and the power source line.

6. The display device of claim 1, further comprising a light emitting control line disposed on the first insulating layer and connected to the pixel circuit unit.

7. The display device of claim 6, wherein the auxiliary power source line covers the light emitting control line when viewed from a plane.

8. The display device of claim 6, further comprising:
   an initialization power source line disposed on the second insulating layer and connected to the pixel circuit unit.

9. The display device of claim 8, wherein the light emitting diode includes a first electrode connected to the pixel circuit unit, a light emitting layer disposed on the first electrode, and a second electrode disposed on the light emitting layer.

10. The display device of claim 9, wherein the pixel circuit unit comprises:
   a first transistor that includes a source electrode connected to the power source line via a fifth transistor, a drain electrode connected to the first electrode of the light emitting diode via a sixth transistor, and a gate electrode connected to a first node;
   a second transistor that includes a source electrode connected to the data line, a drain electrode connected to the source electrode of the first transistor, and a gate electrode connected to the scan line;
   a third transistor that includes a source electrode connected to the drain electrode of the first transistor, a drain electrode connected to the first node, and a gate electrode connected to the scan line;
   a fourth transistor that includes a source electrode connected to the initialization power source line, a drain electrode connected to the first node, and a gate electrode connected to a scan line of a previous stage;
   the fifth transistor that includes a source electrode connected to the power source line, a drain electrode connected to the source electrode of the first transistor, and a gate electrode connected to the light emitting control line;

the sixth transistor that includes a source electrode connected to the drain electrode of the first transistor, a drain electrode connected to the first electrode of the light emitting diode, and a gate electrode connected to the light emitting control line; and a seventh transistor that includes a source electrode connected to the first electrode of the light emitting diode, a drain electrode connected to the initialization power source line, and a gate electrode connected to the scan line of the previous stage.

11. A display device, comprising:

an auxiliary power source line connected to a power source line and that extends in a first direction;

a pixel circuit unit that includes transistors connected to a scan line, a data line, and the power source line;

a bridge pattern connected to the pixel circuit unit with an insulating layer interposed therebetween; and a light emitting diode connected to the transistors through the bridge pattern, wherein the bridge pattern overlaps the auxiliary power source line and forms an additional capacitor with the auxiliary power source line.

12. The display device of claim 11, wherein the transistors include a driving transistor and a switching transistor, and a gate electrode of the driving transistor overlaps the auxiliary power source line to form a storage capacitor.

13. The display device of claim 11, wherein the scan line extends in the first direction, the data line extends in a second direction crossing the first direction, and the power source line extends in the second direction.

14. The display device of claim 11, further comprising a light emitting control line disposed on the first insulating layer and connected to the pixel circuit unit, wherein the auxiliary power source line covers the light emitting control line when viewed from the plane.

15. A display device, comprising:

a first transistor that includes a source electrode connected to a power source line via a fifth transistor, a drain electrode connected to a first electrode of a light emitting diode via a sixth transistor, and a gate electrode connected to a first node;

a second transistor that includes a source electrode connected to a data line, a drain electrode connected to the source electrode of the first transistor, and a gate electrode connected to a scan line;

a third transistor that includes a source electrode connected to the drain electrode of the first transistor, a drain electrode connected to the first node, and a gate electrode connected to the scan line;

a fourth transistor that includes a source electrode connected to an initialization power source line, a drain electrode connected to the first node, and a gate electrode connected to a scan line of a previous stage;

the fifth transistor that includes a source electrode connected to the power source line, a drain electrode connected to the source electrode of the first transistor, and a gate electrode connected to a light emitting control line;

the sixth transistor that includes a source electrode connected to the drain electrode of the first transistor, a drain electrode connected to the first electrode of the light emitting diode, and a gate electrode connected to the light emitting control line;

a seventh transistor that includes a source electrode connected to the first electrode of the light emitting diode, a drain electrode connected to the initialization power source line, and a gate electrode connected to the scan line of the previous stage;

a storage capacitor connected between the power source line and the first node; and an additional capacitor connected between the power source line and the first electrode of the light emitting diode.

16. The display device of claim 15, further comprising:

first, second, and third insulating layers sequentially disposed on a substrate;

an auxiliary power source line disposed on the second insulating layer; and a bridge pattern disposed on the third insulating layer, wherein the scan line is disposed on the first insulating layer, the data line is disposed on the third insulating layer, the power source line is disposed on the third insulating layer, the light emitting control line is disposed on the first insulating layer, and the initialization power source line is disposed on the second insulating layer.

17. The display device of claim 16, wherein the drain electrode of the sixth transistor is connected to the first electrode of the light emitting diode through a bridge pattern, and the auxiliary power source line and the bridge pattern form the additional capacitor.

18. The display device of claim 16, wherein the first transistor is a driving transistor, and a gate electrode of the driving transistor overlaps the auxiliary power source line to form the storage capacitor.

19. The display device of claim 16, wherein the gate electrodes of the first to seventh transistors are disposed on a same layer as the scan line.

20. The display device of claim 15, wherein the light emitting diode includes the first electrode connected to the drain electrode of the first transistor, a light emitting layer disposed on the first electrode, and a second electrode disposed on the light emitting layer.

* * * * *